United States Patent
Miyaki

[11] Patent Number: 5,952,631
[45] Date of Patent: Sep. 14, 1999

[54] SWITCH DEVICE

[75] Inventor: Junichi Miyaki, Tokyo, Japan

[73] Assignee: Sega Enterprises, Ltd., Tokyo, Japan

[21] Appl. No.: 08/756,765

[22] Filed: Nov. 26, 1996

[30] Foreign Application Priority Data

Nov. 30, 1995 [JP] Japan .................................. 7-313270

[51] Int. Cl.⁶ .................................................. H01H 25/04
[52] U.S. Cl. ............................................................ 200/6 A
[58] Field of Search .................................. 74/471; 200/4,
200/5 R, 6 R, 6 A, 17 R, 18, 332, 335,
339, 517; 267/150, 50

[56] References Cited

U.S. PATENT DOCUMENTS

| | | | |
|---|---|---|---|
| 3,020,368 | 2/1962 | Nielsen .................................. 200/86.5 |
| 3,193,628 | 7/1965 | Wanlass ...................................... 200/6 |
| 3,335,240 | 8/1967 | Dhaens et al. ............................ 200/67 |
| 3,731,013 | 5/1973 | Nightengale ................................ 200/4 |
| 3,835,270 | 9/1974 | Dufresne ................................. 200/6 A |
| 4,171,470 | 10/1979 | Gettig ..................................... 200/6 A |
| 4,349,708 | 9/1982 | Asher ..................................... 200/6 A |
| 4,408,103 | 10/1983 | Smith, III ............................... 200/6 A |
| 4,414,438 | 11/1983 | Maier et al. ............................ 200/6 A |
| 4,439,648 | 3/1984 | Reiner et al. ........................... 200/6 A |
| 4,486,629 | 12/1984 | Sledesky ................................. 200/6 A |
| 4,511,769 | 4/1985 | Sahakian et al. ........................ 200/6 A |
| 4,514,600 | 4/1985 | Lentz ..................................... 200/5 R |
| 4,614,847 | 9/1986 | Sasao ..................................... 200/6 A |
| 4,748,441 | 5/1988 | Brzezinski ............................... 340/709 |
| 4,879,556 | 11/1989 | Duimel .................................... 341/20 |
| 5,043,709 | 8/1991 | Kim ....................................... 340/709 |
| 5,283,401 | 2/1994 | Schmucker .............................. 200/6 A |
| 5,349,881 | 9/1994 | Olorenshaw et al. ................. 74/471 X |
| 5,675,309 | 10/1997 | DeVolpi ................................... 338/68 |

FOREIGN PATENT DOCUMENTS

| | | | |
|---|---|---|---|
| 142890 | 5/1985 | European Pat. Off. ....... H01H 25/04 |
| 56-38936 | 9/1981 | Japan . |

*Primary Examiner*—Michael A. Friedhofer
*Attorney, Agent, or Firm*—Price, Gess & Ubell

[57] ABSTRACT

A handle post slants from a neutral position in response to an operational force being applied thereto. A coil spring has a configuration that, through a middle portion of the coil spring, a space is provided between each adjacent turns of the line material which constitutes the coil spring, and, through the remaining two side portions of the coil spring, no space is provided between each adjacent turns of the line material. One end of the coil spring is connected with the handle post. A supporting member is connected with the other end of the coil spring. The supporting member supports the handle post via the coil spring in a manner in which the handle post can slant with respect to the supporting member from the neutral position.

27 Claims, 11 Drawing Sheets

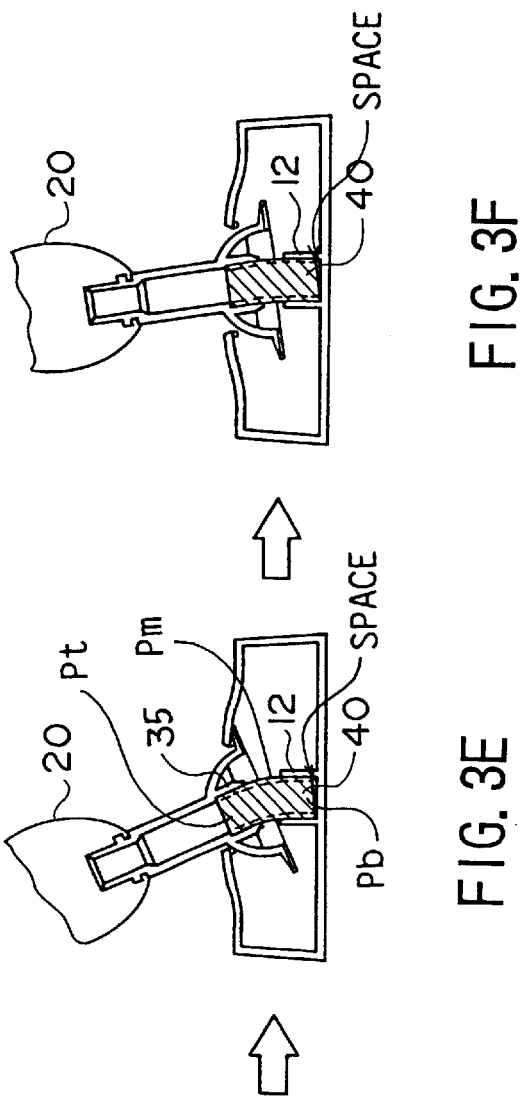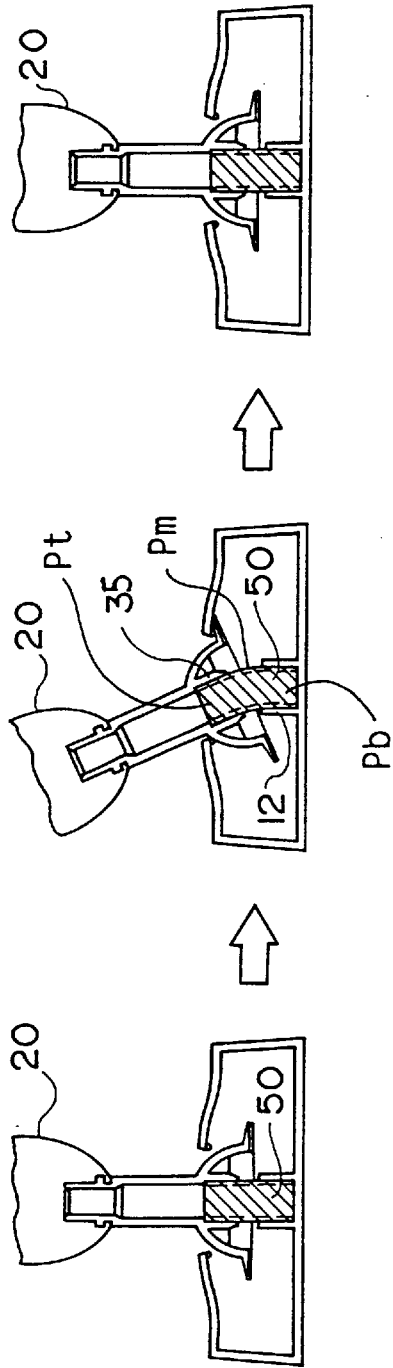

FIG. 14A
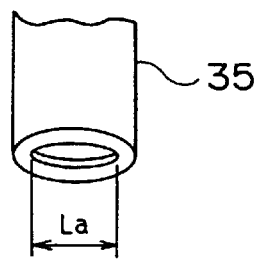
FIG. 14B
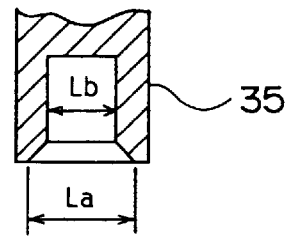
FIG. 15A
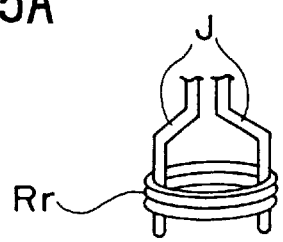
FIG. 15B
FIG. 15C
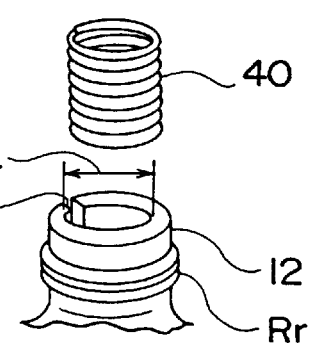
FIG. 15D
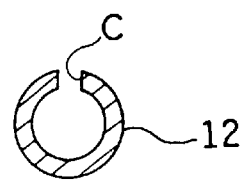

SWITCH DEVICE

BACKGROUND OF THE INVENTION

In processes in chemistry, biology and medicine, separating liquid streams often play an important role. There, it is often the case that in analyses and high-precision separation and dosing processes, highly thinned solutions are finely dosed using nozzles, pipettes or other equipment. Separating liquid streams also play an important role in the sorting of particles, for example, cells from living creatures, using cell sorters, as is described in Herzenberg, L. A., Sweet, R. G., Herzenberg, L. A., "Fluorescence-activated cell sorting," Sci Amer 234(3):108, March 1976. For these reasons, there is a strong desire to be able to automatically monitor such liquid streams with respect to their external parameters, that is, drop speed, drop size, drop distance, position of the separation point and their regularity. Currently, no devices and methods are known that ensure such an automatic monitoring.

SUMMARY OF THE INVENTION

It is an object of the present invention to provide an arrangement and method whereby a separating liquid stream can be automatically monitored. stick should immediately return to a neutral position and come to be at a standstill. By ensuring the switch device to have such functions, an operator can quickly, precisely operate the switch device in synchronization with a progress of a game in a TV/video game machine, for example. It is also demanded such functions of the switch device in an initial condition can be maintained through an operator's repetitive operations being applied thereto.

SUMMARY OF THE INVENTION

An object of the present invention is to provide a switch device having a relatively simple configuration, and having functions that a stick or toggle thereof can be easily caused to slant or tilt by a finger of an operator or the like, and in response to the operator removing the finger or the like from the stick, the stick immediately returns to a neutral position and comes to a standstill. The functions of the switch are not degraded even through repetitive operations being applied to the stick.

A switch device, according to one aspect of the present invention comprises:

a handle post which slants from a neutral position in response to an operational force being applied thereto;

a coil spring, wherein, through a middle portion of the coil spring, a space is provided between each adjacent turns of the line material which constitutes the coil spring, and, through the remaining two side portions of the coil spring, no space is provided between each adjacent turns of the line material, one end of the coil spring being connected with the handle post;

a supporting member, the other end of the coil spring being connected with the supporting member, for supporting the handle post via the coil spring in a manner in which the handle post can slant with respect to the supporting member from the neutral position.

The coil spring used for connecting the handle post and supporting member is a partial non-contact coil spring. In such kind of a coil spring, through a middle portion of the coil spring, a space is provided between each adjacent turns of the line material which constitutes the coil spring (such an adjacent turns non-contact configuration being referred to as a non-contact coil spring configuration, hereinafter), and through the remaining two side portions of the coil spring, no space is provided between each adjacent turns of the line material (such an adjacent turns contact configuration being referred to as a contact coil spring configuration, hereinafter). The two side portions of the coil spring are inserted and connected to the handle post and supporting member, respectively. When the handle post is caused to slant, only the middle portion is bent, and the two side portions in the handle post and boss do not move therein, respectively. This is because only the middle portion has the non-contact coil spring configuration and the non-contact coil spring configuration is easily bent in comparison to the contact coil spring configuration. Further, in the partial non-contact coil spring, each of the two side portions has the contact coil spring configuration. Thereby, a situation is prevented in which removal of an operational force applied to the handle post causes the handle post to return to the neutral position by means of the elastic force of the coil spring and then the handle post further slants in the opposite direction with such swinging being repeated for a long time.

A switch device, according to another aspect of the present invention comprises:

a handle post which slant from a neutral position in response to an operational force being applied thereto;

a coil spring, one end of the coil spring being connected with the handle post;

a supporting member, the other end of the coil spring being connected with the supporting member, for supporting the handle post via the coil spring in a manner in which the handle post can slant with respect to the supporting member from the neutral position; and a centering elastic member for applying the elastic force to the handle post so as to return the handle post to the neutral position when the handle post has slant.

The centering elastic member may comprise other coil springs, which are provided between the handle post and the supporting member approximately along a plurality of directions, each of which directions is approximately perpendicular to the center axis of the handle post. When an operation force is applied to the handle post which thereby slants, a coil spring of the coil springs of the centering elastic member, which coil spring is located opposite to the direction in which the handle post slants, is stretched. The elastic force of the stretched coil spring causes the handle post to return to the neutral position. Thus, a centering function of the switch device is improved, and repetitive swinging of the handle post can be prevented.

Instead or in addition, the centering elastic member may comprise other coil springs, which are provided between the handle post and the supporting member approximately along the direction of the center axis of the handle post, and are arranged around the handle post. When an operational force is applied to the handle post which thereby slants, a coil spring of the coil springs of the centering elastic member, which is located opposite to the direction in which the handle post slants, is stretched. The elastic force of the stretched coil spring causes the handle post to return to the neutral position. Thus, a centering function of the switch device is improved, and repetitive swinging of the handle post can be prevented.

Instead or in addition, the centering elastic member comprises a cushion member which is provided on the supporting member, and pushes back the handle post when the handle post slants and thus pushes the cushion member. When an operational force is applied to the handle post which thereby slants, a portion of the cushion member, which is located opposite to the direction in which the handle post slants, is pressed and depressed. The elastic force of the pressed and depressed portion of the cushion member presses back the handle post to return to the neutral position. Thus, a centering function of the switch device is improved, and repetitive swinging of the handle post can be prevented.

A switch device according to another aspect of the present invention, comprises engaging means for causing the coil spring to engage with at least one of the handle post and the supporting member, so as to prevent the coil spring from moving in the at least one of the handle post and the supporting member when the handle post slants.

The engaging means may comprise screwing means through which the coil spring is screwed into at least one of the handle post and the supporting member. The screwing means comprises an insert pipe, on the inner wall of which a thread corresponding to the line material configuration of the coil spring is formed. The insert pipe is provided in at least one of the handle post and the supporting member through insert molding. In this arrangement, by screwing the coil spring into the boss through the screwing member, the coil spring can be positively fixed in at least one of the handle post and supporting member. Thereby, a problematic situation can be prevented in which the coil spring moves and is drawn in the at least one of the handle post and supporting means and thereby the handle post cannot return to the neutral position. Further, the insert pipe reinforces at least one of the handle post and supporting member.

The engaging means comprises a larger diameter portion which is formed as an end portion of the coil spring. The diameter of the larger diameter portion being larger than the diameter of the other portion of the coil spring. A hole (through hole) is provided in at least one of the handle post and the supporting member, the hole having a diameter which is smaller than the larger diameter portion and is larger than the inner diameter of the other portion of the coil spring. The other portion of the coil spring is inserted into the hole from the rear side. Then, when an external force is applied to the coil spring and the coil spring is pulled toward front side, the large diameter portion comes into contact with an edge of the hole, and the coil spring is prevented from moving toward front side in at least one of the handle post and supporting member. Therefore, when the handle post slants and a portion of the coil spring in at least one of the handle post and supporting member is pulled, the portion of the handle post is prevented from actually moving toward the drawn out direction in at least one of the handle post and supporting member. Thereby, a problematic situation can be prevented in which the coil spring moves and is drawn in the at least one of the handle post and supporting means and thereby the handle post cannot return to the neutral position.

The engaging means may comprise a substance provided between the coil spring and the boss in a melted state and subsequently substance solidified therebetween. Thus, the coil spring is positively fixed in the boss. The substance may comprise one of a predetermined resin and an adhesive.

The engaging means may comprise an engaging pin which has a configuration such that the engaging pin passes through a boss of at least one of the handle post and supporting member and also passes through the coil spring at the same time, after the coil spring is inserted into the boss. Thus, the coil spring is positively fixed in the boss.

The engaging means may comprise a hook-shaped hook portion which is formed as an end portion of the coil spring, a boss provided on at least one of the handle post and the supporting member, and a through hole which is formed inside of the boss, and has a shape such that the hook portion of the coil spring can pass through the through hole only in a condition in which the coil spring is in a predetermined directional position. The coil spring is caused to pass through the through hole in the predetermined directional position, and the coil spring is then caused to turn so as not to be in the predetermined directional position. Thus, the coil spring is positively fixed in the boss.

The engaging means may comprise a boss provided on at least one of the handle post and the supporting member, a pass through member which has a through hole through which the line material of the coil spring passes, and a connecting screw which connects the pass through member to the boss. The coil spring is caused to turn and passes through the through hole of the pass through member which is previously fixed inside of the boss. It is also possible that, first, the coil spring is caused to turn and passes through the through hole of the pass through member, and the pass through member is then fixed inside the boss together with the coil spring. Thus, the coil spring is positively fixed in the boss.

The engaging means may comprise a boss provided on at least one of the handle post and the supporting member. The boss has a predetermined elasticity and can have the coil spring inserted therein and another larger diameter coil spring which has the inner diameter smaller than the outer diameter of the boss. An external force is applied to the larger diameter coil spring which has the inner diameter forced to be elongated, thereby the larger diameter coil spring can be positioned to surround the boss. Then, the external force is removed and the larger diameter coil spring pushes the boss inwardly so as to prevent the coil spring inside the boss from moving in the drawn out direction in the boss. Thus, the coil spring is positively fixed in the boss.

The engaging means may comprise a predetermined space formed between adjacent end turns of the line material of the coil spring. A boss is provided on at least one of the handle post and the supporting member, a through hole is provided in each of opposite walls of the boss, and a pass through pin which has a configuration such that the pin passes through the predetermined space of the coil spring and also passes through the two through hole of the boss at the same time. The coil spring is positively fixed in the boss. Such a space between adjacent turns of the line material of the coil spring may be provided at any position through the coil spring and the position of the through holes of the boss may be changed accordingly.

The engaging means may comprise a boss provided on at least one of the handle post and the supporting member and projections which project from the inner wall of the boss so that the distance between opposite ends of the projections is shorter than the outer diameter of the coil spring. The projections are melted as a result of the coil spring being heated, pressed and inserted into the boss. The hot coil spring is pressed and is inserted into the boss. When the coil spring and the boss are cooled, the coil spring is tightly fixed in the boss.

The engaging means may comprise a boss provided on at least one of the handle post and the supporting member, and projections projecting from the inner wall of the boss. The distance between opposite ends of the projections is shorter than the outer diameter of the coil spring. An external force is applied to the coil spring for twisting the coil spring in a predetermined direction such that the outer diameter of the coil spring is shortened. The coil spring thereby can be inserted in the boss. After the coil spring is inserted into the boss, the elastic force of the coil spring causes the coil spring to push the projections outwardly. Thus, the coil spring is securely fixed in the boss.

The engaging means may comprises a boss provided on at least one of the handle post and the supporting member and projections, each of which extends outwardly from the center axis of the boss. The length between opposite ends of the projections is longer than the inner diameter of the coil spring. An external force is applied to the coil spring for twisting the coil spring in a predetermined direction such that the outer diameter of the coil spring is shortened. The coil spring can then be inserted in a space between the projections and the inner wall of the boss. After the coil spring is inserted into the space, the elastic force of the coil spring causes the coil spring to push the projections inwardly. Thus, the coil spring is securely fixed in the boss.

The engaging means may comprise a boss provided on at least one of the handle post and the supporting member, the inner diameter of the boss at the end being longer than the inner diameter of an inside portion of the boss. The outer diameter of the coil spring is smaller than the inner diameter of the boss at the end and longer than the inner diameter of the inside portion of the boss. That is, an end portion of the boss is tapered. The coil spring is press fitted into the boss along the tapered portion.

The above-described engaging means prevent a situation in which the coil spring moves in the drawn out direction in the boss of the handle post and/or supporting member as a result of being pulled when the handle post is caused to slant with respect to the supporting member and the handle post cannot return to the neutral position.

Other objects and further features of the present invention will become more apparent from the following detailed description when read in conjunction with the accompanying drawings.

BRIEF DESCRIPTION OF THE DRAWINGS

FIGS. 3A, 3B, 3C, 3D, 3E and 3F illustrate an advantage of the second embodiment;

FIGS. 14A and 14B show a configuration of a boss of a handle post, which can be applied to each embodiment;

FIGS. 15A, 15B, 15C and 15D shows a configuration of a fifth variant embodiment of the sixth embodiment;

DETAILED DESCRIPTIONS OF PREFERRED EMBODIMENTS

Figure 1A:
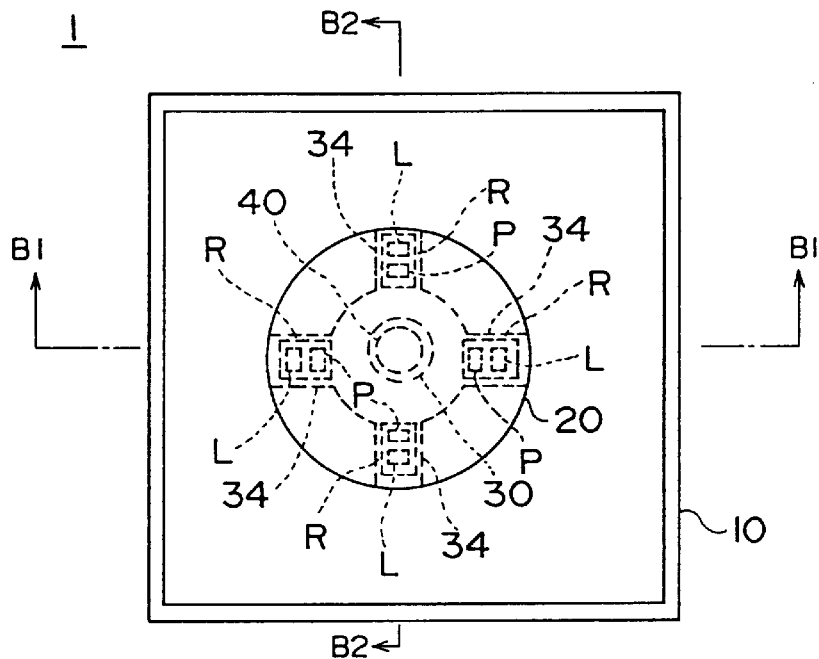
FIGS. 1A and 1B shows a configuration of a first embodiment of the present invention.
Figure 1B:
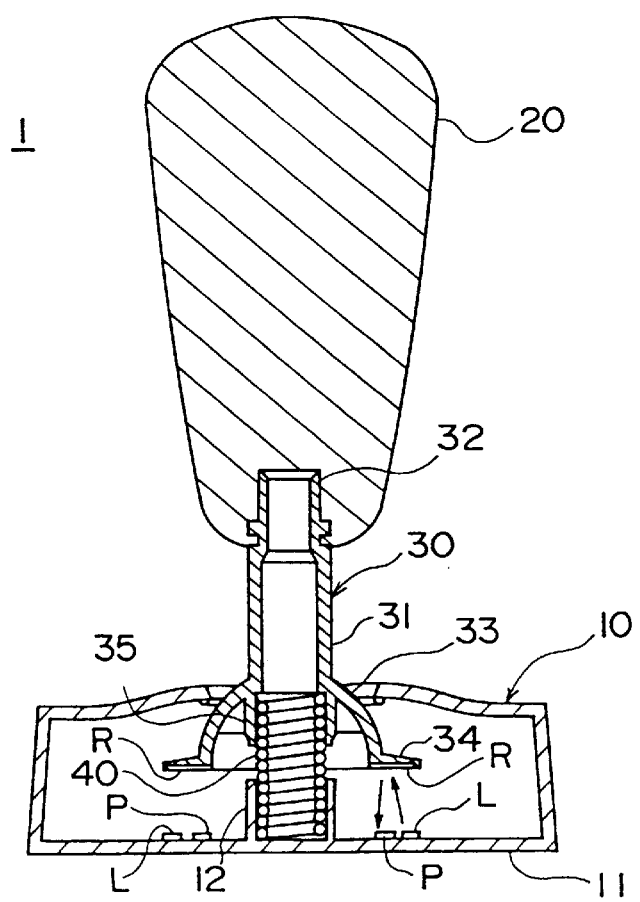

With reference to FIGS. 1A, 1B, a switch device in a first embodiment of the present invention will now be described.

FIG. 1A shows a plan view of the switch device 1, and FIG. 1B shows a longitudinal, elevational, sectional view, along a line B1—B1 of FIG. 1A and, also, along a line B2—B2 of FIG. 1A.

This switch device 1 is referred to as a joystick, and includes a case 10, a stick or toggle 20 which an operator operates, a handle post 30 having the stick 20 mounted on the top thereof and a spring 40 which couples the handle post and case 10.

A cylindrical boss 12 extends vertically from a bottom plate 11 of the case 10. A bottom end portion of the spring 40 is inserted into the boss 12, and is fixed thereto. The handle post 30 includes an approximately cylindrical shaft portion 31, a fixing portion 32 which is provided at the top of the shaft portion 31 and has the stick 20 fixed thereon, a hemispherical bottom portion 33 provided at the bottom of the shaft portion 31 in a manner in which the opening of the bottom portion 33 faces downwardly and extending portions 34 which extend outwardly in four different directions at a right angle to each other. A cylindrical boss 35 extends downwardly from an inner surface of the bottom portion 33 so as to continue downwardly from the shaft portion 31. A top end portion of the spring 40 is inserted in the boss 35 and is fixed thereto.

In this configuration, only the spring 40 connects between the handle post 30 and case 10. Therefore, when an operator applies a horizontal force in FIG. 1B to the stick 20 with a finger or the like, the stick 20 can slant or tilt against the elastic force of the spring 40, as shown in FIG. 3B.

As shown in FIGS. 1A, 1B, an LED (Light Emitting Diode) L and a photodiode P are adjacently provided in each direction of the four directions on the bottom portion 11 of the case 10 around the boss 12. Facing thereto, a reflecting plate R is provided on the bottom surface of each extending portion 34, in each of the four directions, of the handle post 30. Although not shown in the figures, a printed circuit board is provided on the top surface of the bottom portion 11 of the case 10 and the respective LEDs L, photodiodes P are provided on the printed circuit board.

Under control of a control circuit of the printed circuit board or an external control circuit, each LED L periodically emits light. The emitted light is reflected by the reflecting plate R which faces the LED L and the reflected light is received by the photodiode P which faces the reflecting plate R. The photodiode P transmits a light-reception signal which indicates the intensity of the received light, and the light-reception signal is transmitted to an external control circuit or the like via the printed circuit board in the case 10.

When the stick 20 slants leftward as shown in FIG. 3B, the left side extending portion 34 of the handle post 30 approaches the bottom portion 11 of the case 11. As a result, the intensity of the light, which is emitted by the left side LED L, becomes relatively stronger and is reflected by the facing reflecting plate R and is received by the facing photodiode P. At this time, the right side extending portion 34 of the handle post 30 moves away from the bottom portion 11 of the case 10. As a result, the intensity of the light, which is emitted by the right side LED L, becomes relatively weaker and is reflected by the facing reflecting plate R and is received by the facing photodiode P. Such light-reception intensity changes are indicated by the light-reception signals which are transmitted from the respective photodiodes P, and is transmitted to the external control circuit or the like via the printed circuit board. Thus, a slanting state of the stick 20 which is caused to slant by an operation of an operator is detected through the light-reception signals from the photodiodes P.

A method of detecting a slanting state of the stick 20 is not limited to the above-described method. For example, each pair of the LED L and photodiode P can be replaced by a pair of electric contacts, the setting location thereof is shifted upward by a predetermined distance, and the reflecting plate R is replaced by an electric contact which causes a short-circuit between the above-mentioned pair of electric contacts. In this arrangement, when the stick 20 slants leftward as shown in FIG. 3B, the left side pair of electric contacts are electrically short-circuited. Thereby, the slanting state is detected.

Figure 2:
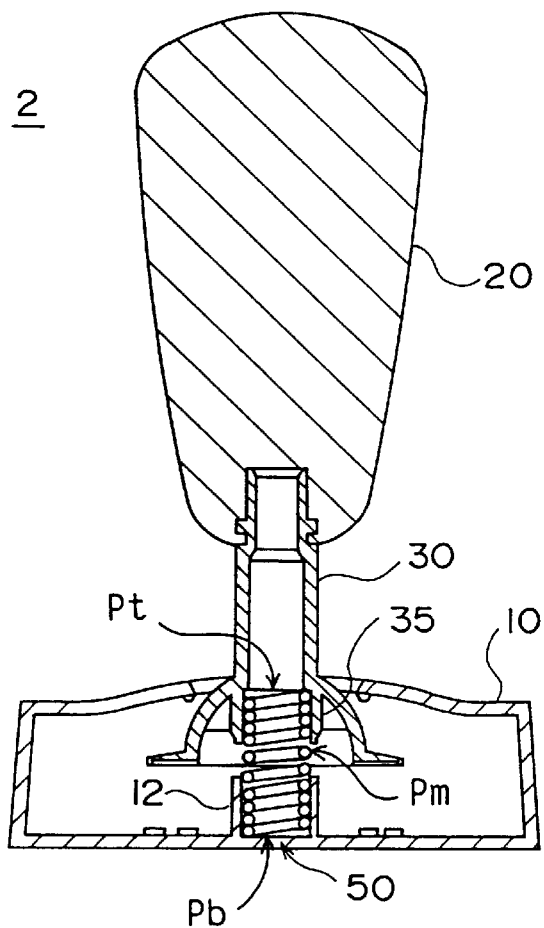
FIG. 2 show a configuration of a second embodiment of the present invention.

With reference to FIG. 2, a switch device in a second embodiment of the present invention will now be described. This switch device 2 is identical to the above-described switch device 1 in the first embodiment except for a configuration of the spring. The same reference numerals are given to the corresponding parts, and duplicate descriptions will be omitted.

The spring 40 used in the switch device 1 in the first embodiment is a well-known coil spring. The coil spring is a contact-type coil spring. That is, when this coil spring is in a state in which no external force is applied thereto, each of the adjacent wire turns are in contact with one another throughout the entire length of the wire of the coil spring as shown in FIG. 1B. (Throughout the specification, each coil spring is not limited to a metallic coil spring and a coil spring made of another material may be used instead of a metallic coil spring. For example, instead of a metallic coil spring, a plastic coil spring can be used.) With reference to FIGS. 3A, 3B, 3C, operations of the switch device will now be described when such a contact-type coil spring 40 is used as an elastic supporting member.

When an operator presses the stick 20 so that the stick slants leftward, as shown in FIG. 3B, only a right side portion of the spring is stretched. The contact-type coil spring 40 has the right side portion stretched uniformly through the entire length. As a result, the bottom end of the right side portion of the spring 40 may move upward, and a space is formed between the right side end of the coil spring 40 and the bottom surface of the boss 12. Once such a space is formed between the bottom end of the spring 40 and the bottom surface of the boss 12, even after the operator releases the stick 20 so as to remove the operational force, the right bottom portion of the coil spring 40 which was moved upwardly may not return to the original position in the boss 12. As a result, the space formed by the movement problematically remains as it is. If such a space remains, as shown in FIG. 3C, even though no operational force is applied to the stick 20, the stick 20 could maintain a slanting state, and does not return to the neutral position.

In order to prevent such a situation from occurring, instead of the contact-type coil spring 40, a non-contact type coil spring may be used. In such a non-contact type coil spring, in a state in which no external force is applied thereto, each of the adjacent wire turns are spaced from one another through the entire length of the coil spring. If such a non-contact type coil spring is used as the elastic supporting member, when the stick 20 is caused to slant as shown in FIG. 3B, only a middle portion Pm of the coil spring is bent and the portion Pb thereof inserted in the boss 12 and the portion Pt thereof inserted into the boss 35 of the handle post 30 are not bent. Thereby, upward movement of the bottom end of the coil spring in the boss 12 can be prevented. Therefore, when an operator releases the stick 20, the stick 20 can return to the neutral position (the position shown in FIG. 3A).

When such a non-contact type coil spring is used as the elastic supporting member instead of the contact type coil spring 40, after an operator releases the stick 20, the stick 20 returns to the neutral position from the leftward slanting position. However, after returning to the neutral position, the stick may slant rightwardly as a reaction to the rightward movement of the stick for returning to the neutral position. Thus, the stick 20 may alternately swing between left and right repetitively, and considerable time may elapse until the stick 20 comes to a standstill in the neutral position. Occurrence of such a repetitive swinging of the stick 20 each time the stick 20 is operated may prevent an operator from appropriately operating the switch device, and also, may cause friction heating in movable portions of the switch device. As result of such repetitive swinging of the stick 20, the life of the switch device may be shortened.

In the second embodiment of the present invention, a partial non-contact type coil spring 50 is used instead of the contact-type coil spring 40. The above-described problems which may occur in the respective cases of using the contact-type coil spring and using the non-contact type coil spring can be solved.

Figure 4:
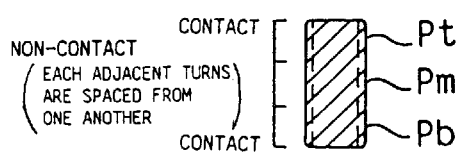
FIG. 4 shows a configuration of a coil spring which is used in a switch device shown in FIG. 2.

The partial non-contact type coil spring 50, as shown in FIG. 2, has only the middle portion Pm of the spring 50 of the non-contact type, the middle portion Pm being a portion of the spring 50 other than a bottom portion Pb thereof which is inserted into the boss 12 of the case 10 and a top portion Pt which is inserted into the boss 35 of the handle post 30. It will be noted that, in FIG. 2, the space between each adjacent pair of wire turns in the middle portion Pm has been enlarged for the sake of clearly showing the configuration of the partial non-contact coil spring 50. However, actually, each space is so small that it is necessary to approach the spring very closely for confirming the space with the human eye. As shown in FIG. 4, each of a top approximately ⅓ portion Pt and a bottom approximately ⅓ portion Pb of the entire length of the spring 50 is of a contact type. The remaining middle approximately ⅓ portion Pm is of non-contact type. In this middle portion Pm, when no external force is applied thereto, each of the adjacent wire turns are spaced from one another by a predetermined distance through the entire length of the middle portion Pm.

Operations of the switch device in the second embodiment which uses such a partial non-contact coil spring will now be described with reference to FIGS. 3D, 3E and 3F.

When an operator moves the stick 20 leftward as shown in FIG. 3E, a right side portion of the spring 50 is stretched. Because the spring is of the partial non-contact type, the right side portion is not uniformly stretched. Actually, on the right side portion, substantially only the middle portion Pm of the non-contact type is stretched and the top and bottom portions Pt, Pb of the spring 50, inserted into the bosses 35, 12, respectively, are not substantially stretched. Therefore, the problem of a right side portion of the spring 50 being drawn up in the boss 12 of the case 10 can be prevented. When the operator releases the stick 20, the elastic force of the spring 50 causes the handle post 30 as well as the stick 20 to return to the neutral position (corresponding to the position shown in FIG. 3F).

Further, in the second embodiment, only the middle portion Pm of the spring 50 is of the non-contact type. Therefore, the length of the alternately repetitive swinging of the handle post 30, which may occur as a reaction of the handle post 30 returning, after the operator releases the handle post 30 and the handle post 30 returns to the neutral position, is small. Further, the repetitive swinging rapidly attenuates and the handle post rapidly comes to a standstill. It is easy for the operator to perform a subsequent operation using the stick 20. Further, frictional heating due to the repetitive swinging of the movable components is also prevented and the life of the switch device is increased.

Figure 5A:
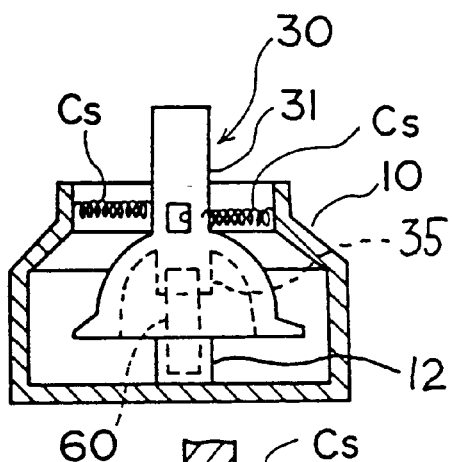
FIGS. 5A and 5B show a configuration of a third embodiment of the present invention.
Figure 5B:
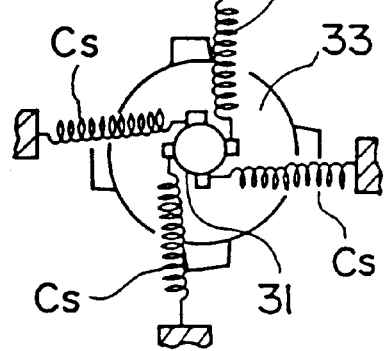

FIGS. 5A and 5B shows a switch device in a third embodiment.

In this embodiment, the switch device is obtained as a result of additionally providing four coil springs Cs to the switch device of either the first embodiment or the second embodiment. Each of the four coil springs Cs is provided between the inner wall of the case 10 and the shaft portion 31 of the handle post 30. The coil springs Cs improve the centering function of the handle post 30 returning to the neutral position. The coil spring 60 inserted into the boss 35 of the handle post 30 and also into the boss 12 of the case 10 may be any one of above-described contact type coil spring, non-contact type coil spring or partial non-contact type coil spring.

As shown in FIG. 5B, four fixing portions project in four directions from the outer wall of the shaft portion 31, and four fixing portions are provided in four directions to the inner wall of the case 10. As shown in FIG. 5B, one end of each coil spring Cs is connected with one of the four fixing portions of the shaft portion 31 and the other end of the coil spring Cs is connected to one of the four fixing portions of case 10. The fixing portion of the shaft portion 31 is provided in one direction and the fixing portion of the case 10 is provided in one direction offset by 90° from the direction of the fixing portion of the shaft portion 31. When the handle post 30 is caused to slant leftwardly as shown in FIG. 3B, the right side coil spring Cs is stretched. In the right side coil spring Cs, a pulling force corresponds to the amount of stretch of the spring. Therefore, when an operational force applied to the stick 20 is removed, the above-mentioned pulling force of the spring Cs causes the handle post 30 to swing rightwardly, and to return to the neutral position. Then, if the handle post 30 swings further to the right after passing the neutral position, due to a reaction, the left side centering spring Cs is stretched. The pulling force which occurs in the spring Cs causes the handle post 30 to return to the neutral position.

Thus, by the four centering springs Cs, when an external operational force applied to the stick 20 is removed, the stick 20 (handle post 30) rapidly returns to the neutral position and comes to a standstill. Thus, the centering function is improved.

Figure 6:
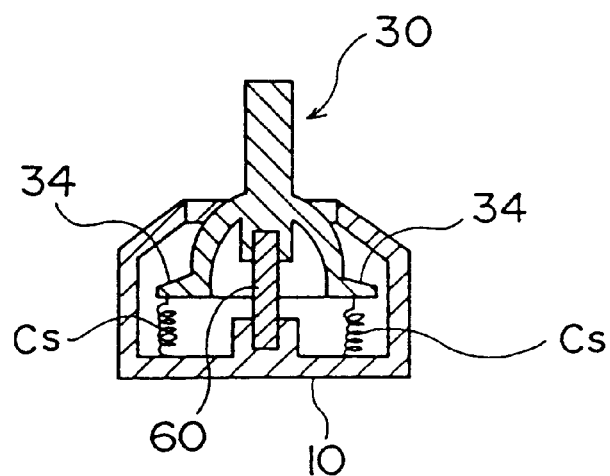
FIG. 6 shows a configuration of a variant embodiment of the third embodiment.

FIG. 6 shows a variant embodiment of the third embodiment. In this embodiment, one end of each of four centering springs Cs is connected to a respective one of the four extending portions 34, and the other end of the centering spring Cs is connected to the bottom portion of the case 10. Also in this embodiment, as described above for the third embodiment, when the handle post 30 is caused to slant leftwardly as shown in FIG. 3B, the right side coil spring Cs is stretched. In the right side coil spring Cs, a pulling force corresponds to the amount of stretch of the spring. Therefore, when an operational force applied to the stick 20 is removed, the above-mentioned pulling force of the spring Cs causes the handle post 30 to swing rightwardly, and return to the neutral position. Then, if the handle post 30 swings further right after passing the neutral position as a reaction, the left side centering spring Cs is stretched. The pulling force of this spring Cs causes the handle post 30 to return to the neutral position.

Thus, by the four centering springs Cs, when an external operational force applied to the stick 20 is removed, the stick 20 (handle post 30) rapidly returns to the neutral position and comes to a standstill. Thus, the centering function is improved. In this variant embodiment of the third embodiment, shown in FIG. 6, each extending portion 34 is provided with a portion, which is used for fixing one end of the spring Cs. This is in addition to providing the portion on which the reflecting plate R, shown in FIG. 1.

Figure 7A:
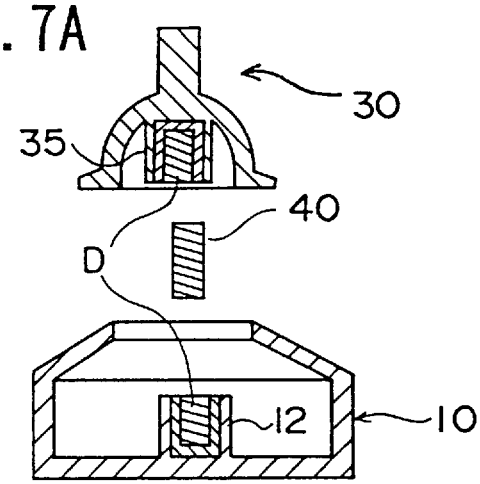
FIGS. 7A and 7B show a configuration of a fourth embodiment of the present invention.
Figure 7B:
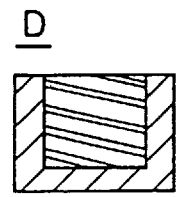

FIG. 7 shows a configuration of a switch device in a fourth embodiment. The configuration of this switch device is approximately identical to the switch device in the first embodiment shown in FIG. 1. However, a cylindrical internal threaded member D, which is formed through die casting, is provided in the boss 35 of the handle post 30 and the boss 12 of the case 10 through insert molding. That is, the bosses are formed by insert molding. As shown in FIG. 7B, the inner wall of each of the internal threaded members D has internal thread formed therein. The internal thread has a configuration which corresponds to the wire turn arrangement of the spring 40 which is inserted into the members D. When assembling the case 10, handle post 30 and spring 40, one end of the spring 40 is screwed into and is fixed in the internal threaded member D of the boss 12 of the case 10. Then, the other end of the spring 40 is screwed into and fixed in the internal thread D of the boss 35 of the handle post 30. Thus, the outer surface of the spring 40 acts as an external thread corresponding to the internal thread of each internal threaded member D.

Because of such screw fixing of the spring-and-handle post connection and the spring-and-case connection, when the spring 40 is bent as a result of an external force which causes the handle post 30 to slant, the possibility that a respective end of the spring 40 is drawn up in the boss 12 and/or the boss 35 can be prevented. Thereby, the handle post 30 can return positively to the neutral position after the external force is removed.

Figure 8:
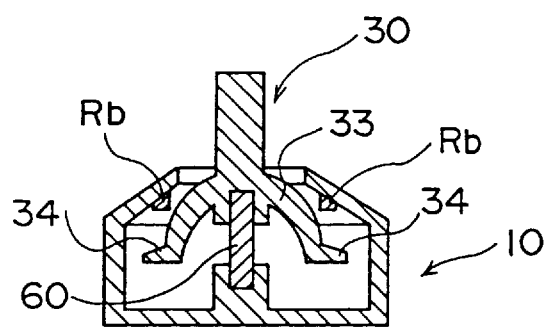
FIG. 8 shows a configuration of a fifth embodiment of the present invention.

FIG. 8 shows a configuration of a switch device in a fifth embodiment. The configuration of this switch device is approximately identical to the switch device in the first embodiment shown in FIG. 1. However, instead of the contact type spring 40, a non-contact type spring 60 is used for connecting the handle post 30 and case 10. As shown in the figure, an inner wall of a top tapering portion of the case 10 has a rubber cushion Rb attached thereon. The rubber cushion may be provided to form a ring which faces the upper surface of the hemispherical bottom portion 33 of the handle post 30. Alternatively, the rubber cushion Rb may be provided in the four directions corresponding to the directions of the four extending portions 34, respectively.

When the handle post 30 is caused to slant leftwardly as shown in FIG. 3B, a right side portion of the bottom portion 33 or the extending portion 34 is pressed against the rubber cushion Rb. As a result, the rubber cushion Rb is deformed. The deformation of the rubber cushion Rb results in generation of a force, in an amount corresponding to the rubber cushion deformation amount, which force may press back the bottom portion 33 or the extending portion 34. When an external operational force applied to the handle post 30 is removed, the pressing force of the rubber cushion Rb returns the handle post 30 rightwardly and returns the handle post 30 to the neutral position. If the handle post 30 then swings rightwardly from the neutral position as a reaction, a left side portion of the bottom portion 33 or the extending portion 34 is pressed against the rubber cushion Rb, which is then deformed. The deformation results in generation of a pressing back force which returns the handle post 30 to the neutral position. Thus, occurrence of continuous swinging of the handle post 30, which is likely to occur when using a non-contact type coil spring, can be effectively prevented.

Figure 9:
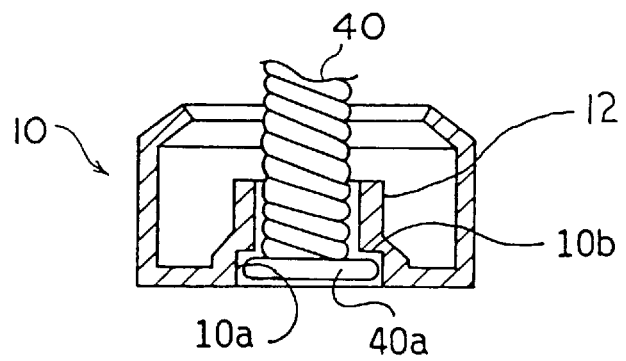
FIG. 9 shows a configuration of a sixth embodiment of the present invention.

FIG. 9 shows a configuration of a switch device in a sixth embodiment of the present invention. This switch device has a configuration approximately identical to the configuration of the switch device in the first embodiment shown in FIG. 1. However, the outer diameter of the wire turn 40a at the bottom end of the coil spring 40, which is inserted into and fixed in the boss 12 of the case 10, is wider than the other wire turns. Corresponding thereto, the inner diameter of the boss 12 is wider at the bottom and, as shown in the figure, an opening 10a is formed at the bottom of the boss 12. The opening 10a has a diameter which is the same as the diameter of the bottom portion of the boss 12, and is aligned with the boss 12. When assembling the spring 40 to the case 10, the coil spring 40 is inserted into the boss 12 through the opening 10a. The inner diameter of the boss 12, except for the bottom portion, is larger than the outer diameter of the spring 40, except for the larger diameter wire turn 10a. The outer diameter of the bottom wire turn 10a of the spring 40 is larger than the inner diameter of the boss 12, except for the bottom thereof. A step portion 10b is formed in the boss 12 between the upper portion of the boss 12 and the bottom portion thereof. When the spring 40 is pulled upwardly, the spring 40 cannot be drawn upwardly because the larger diameter bottom wire turn comes into contact with the step portion 10b.

By such a configuration, when an external operational force is applied to the handle post 30 and thereby the spring 40 is bent, a possibility of the bottom of the spring 40 being drawn up from the bottom of the boss 12 as shown in FIG. 3B can be prevented. Accordingly, when an operational force applied to the handle post 30 is removed, the handle post 30 positively returns to the neutral position.

In addition to this, or alone, a similar configuration may be applied for the boss 35 of the handle post 30. Thereby, the spring 40 is positively fixed to the boss 35 and the spring 40 is prevented from being drawn up from the bottom of the boss 35.

Figure 10:
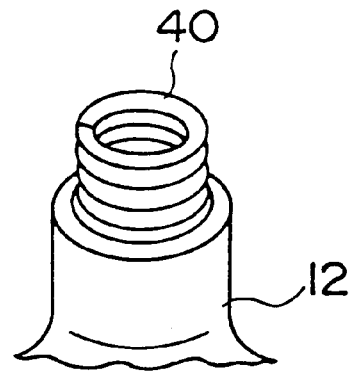
FIG. 10 shows a configuration of a first variant embodiment of the sixth embodiment.

FIG. 10 shows a first variant embodiment of the sixth embodiment. In this variant embodiment, instead of using such a configuration as that shown in FIG. 9, the following arrangement is used. When the spring 40 is inserted into and fixed in the boss 12, melted epoxy resin or the like is poured between the outer wall of the spring 40 and the inner wall of the boss 12. After the melted resin has solidified therebetween, the spring 40 is positively fixed in the boss 12. It is also possible to use an adhesive instead of melted epoxy resin, and the adhesive force of the adhesive positively fixes the spring 40 in the boss 12.

In addition to this, or alone, a similar configuration may be applied for the boss 35 of the handle post 30. Thereby, the spring 40 is positively fixed to the boss 35, and drawing up of the spring 40 from the boss 35 can be prevented.

Figure 11A:
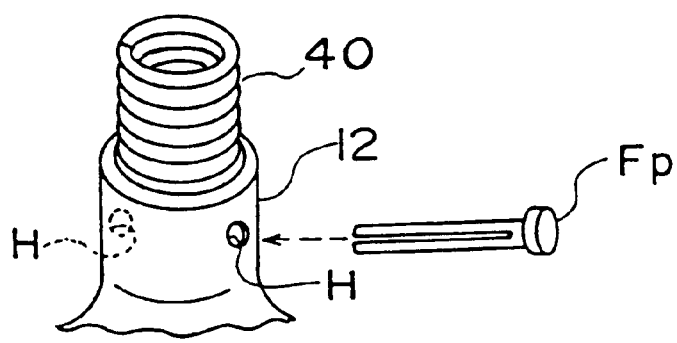
FIGS. 11A and 11B shows a configuration of a second variant embodiment of the sixth embodiment.
Figure 11B:
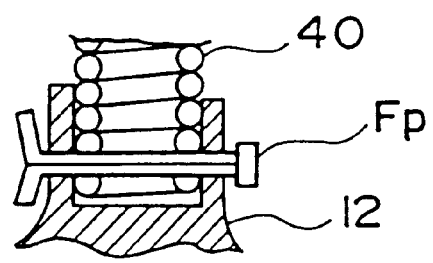

FIGS. 11A, 11B show a second variant embodiment of the sixth embodiment. In this variant embodiment, instead of using the configuration shown in FIG. 9, as shown in FIGS. 11A, 11B, a fixing pin Fp is used. The fixing pin Fp has a slender portion extending straight from the head, and the slender portion is divided into two parts, the dividing line being in the extending direction of the pin. The fixing pin Fp is used for positively fixing the spring 40 in the boss 12. Through holes H are provided in opposite positions of the walls of the boss 12. Further, at the corresponding positions of the coil spring 40, part of the wire turns is cut out for the fixing pin Fp to be easily inserted therein. When fixing the spring 40 in the boss 12, after inserting the spring 40 into the boss 12, the through holes H and the above-mentioned cut out portions of the spring 40 are caused to be aligned with each other, the slender portion of the fixing pin Fp being then inserted therein. Then, projecting ends of the two parts of the slender portion of the fixing pin Fp, which project externally from the opposite side of the boss 12, are bent in opposite directions, as shown in FIG. 11B. Thereby, the fixing pin Fp is prevented from being drawn out from the boss 12. Thus, the fixing pin Fp positively fixes the spring 40 in the buss 12.

In addition to this, or alone, a similar configuration may be applied for the boss 35 of the handle post 30. Thereby, the spring 40 is positively fixed to the boss 35, and drawing up of the spring 40 from the boss 35 can be prevented.

Figure 12A:
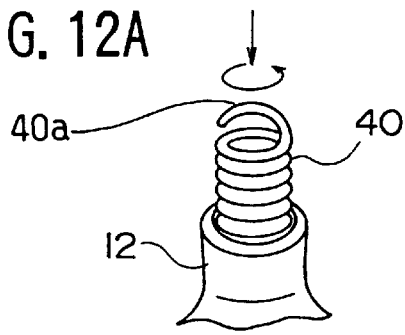
FIGS. 12A, 12B, 12C and 12D show a configuration of a third variant embodiment of the sixth embodiment.
Figure 12B:
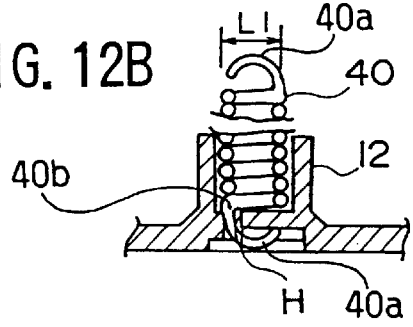
Figure 12C:
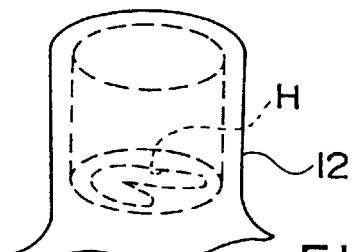
Figure 12D:
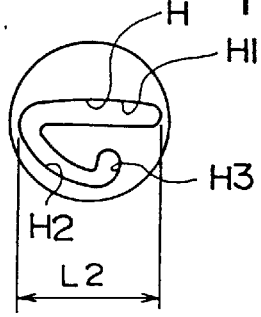

FIGS. 12A, 12B, 12C, 12D show a third variant embodiment of the sixth embodiment. In this variant embodiment, instead of using the configuration shown in FIG. 9, each of opposite end portions of the wire of the spring 40 is bent to form a hook, as shown in FIGS. 12A, 12B. Each of these bent portions is referred to as a hook like portion 40a. Further, a through hole H is formed in the bottom of the boss 12, the through hole H having a shape as shown in FIG. 12D. The hook like portion 40a at an end of the spring 40 is inserted into and fixed in the through hole H, as will now be described. When fixing the coil spring 40 in the boss 12, an end of the spring 40 is inserted into the boss 12 and the hook like portion 40a of the end of the spring 40 passes through a straight-line portion H1 of the through hole H. Then, the spring 40 is turned counterclockwise when viewed from the top. Thus, a portion 40b of the wire of the spring 40, at which the hook like portion 40a starts, is rotated counterclockwise by approximately 90°, passing through a curved portion H2 of the through hole H. Consequently, the above-mentioned portion 40b of the wire of the spring 40, at which the hook like portion starts, reaches an end H3 of the through hole H.

The outer horizontal length L1, in FIG. 12B, of each hook like portion 40a is slightly shorter than the length L2 of the straight-line portion H1 of the through hole H. Therefore, after inserting the hook like portion 40a into the through hole H and rotating it counterclockwise by approximately 90°, the hook like portion 40a cannot be removed from the through hole H unless the hook like portion 40a is caused to turn in the reverse direction. Thus, the spring 40 is positively fixed in the boss 12.

A configuration similar to the configuration in which the through hole H is formed at the bottom portion of the boss 12 is provided at the top portion of the boss 35 of the handle post 30. In a fixing method, as the method described above, the spring 40 is positively fixed in the boss 35 of the handle post 30.

Figure 13A:
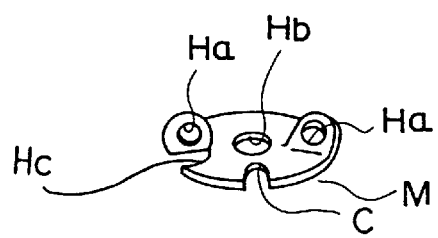
FIGS. 13A and 13B show a configuration of a fourth variant embodiment of the sixth embodiment.
Figure 13B:
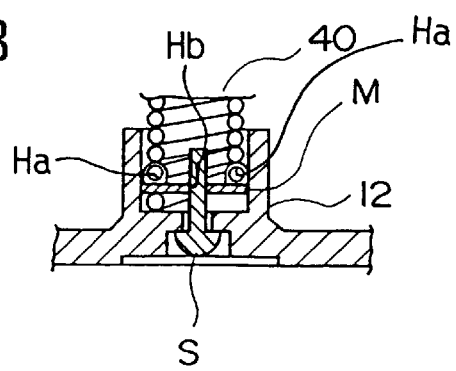

FIGS. 13A, 13B show a fourth variant embodiment of the sixth embodiment. In this variant embodiment, instead of using the configuration shown in FIG. 9, a metal disc M having a shape as shown in FIG. 13A and a fixing screw S are used for positively fixing the spring 40 in the boss 12.

In the metallic disc M, opposite edge portions are cut and obliquely raised. Each of the cut and raised portions has a through hole Ha formed therein, the diameter of each through hole Ha is slightly larger than the outer diameter of the wire of the coil spring 40. A fixing through hole Hb is formed at the center of the metallic disc M for fixing the fixing screw S therein. An internal thread is formed on the wall of the hole Hb, the internal thread corresponding to an external thread formed on the fixing screw S. A cut-out C is formed at an edge portion of the metallic disc M for allowing electrical wires to pass therethrough.

Normally, in such kind of switch device, a stick such as the stick 20 has some push button switches or the like provided thereon (not shown in the figures). In order to electrically connect such push button switches or the like with external control circuit or the like, electrical wires pass through the handle post 30, pass through the boss 12 of the case 10, and are drawn externally. The above-mentioned cut-out C is used for allowing the electrical wires to pass through the boss 12.

When assembling, the metallic disc M is fixed in the boss 12 at a level slightly higher than the bottom surface of the boss 12 by means of the screw S. Then, one end of the coil spring 40 is inserted into the boss 12. At this time, the coil spring 40 is turned counterclockwise when viewed from the top while being inserted in the boss 12 so that the inserted end of the wire of the coil spring 40 passes through the through hole Ha of one of the two above-mentioned cut and raised portions. Thus, while the coil spring 40 is turned, the inserted end of the wire of the coil spring 40 passes through the through hole Ha of one of the cut and raised portions, passes through the through hole Ha of the other cut and raised portion, and passes through an adjacent one of two cut-out portions Hc, which are formed in the metallic disc M when cutting and raising so as to form the cut and raised portions, respectively. The wire of the spring 40 passes through the through holes Ha of the cut and raised portions and the cut-out portion Hc while the coil spring 40 is turned. Thus, the wire of the coil spring 40 is inserted into a space below the metallic disc M in the boss 12 gradually, as the coil spring 40 is turned continuously. The inserted end of the wire of the coil spring 40 reaches the bottom surface of the boss 12, and the coil spring 40 is fixed in the boss 12.

The above-described configuration of the metal disc M and manner of fixing the coil spring 40 in the boss 12 is one example. Variant embodiments thereof may be considered. For example, the metallic disc M shown in FIG. 13A is also used for a coil spring, which has a wire winding direction reverse to the wire winding direction of the coil spring 40 shown in FIG. 13B. In this case, the inserted end of the wire of the coil spring passes through one through hole Ha, passes through the opposite side hole Ha, and then passes through the further opposite side cut-out portion, so that the wire of the coil spring 40 is inserted into the space below the metallic disc M, while the coil spring is turned clockwise when viewed from the top. In this case, it is also possible that, while the coil spring 40 is turned, the inserted end of the wire of the coil spring 40 passes through one through hole Ha, and passes through the opposite side cut out portion, without using the remaining through hole Ha. The shape of a member having a function similar to that of the metallic disc M may be one of various shapes other than the shape of the metallic disc M, allowing the wire of the coil spring 40 to smoothly pass through this member, and positively fixing the coil spring 40 after an end portion of the coil spring 40 is inserted into a space below the member in the boss 12.

A configuration similar to a configuration such as that in which the metallic disc M is fixed by means of the fixing screw S in the boss 12 is provided in the boss 35 of the handle post 30. In a fixing method similar to that described above, the coil spring 40 is positively fixed in the boss 35 of the handle post 30.

FIGS. 14A, 14B show a configuration of the boss 35 of the handle post 30, which boss can be applied to each embodiment described in the specification. The corner between the inner wall and the end surface of the bottom end of the boss 35 is chamfered as shown in FIG. 14B. As a result, the inner diameter La of the end of the boss is larger than the inner diameter Lb of an upper portion of the boss 35. The end inner diameter La of the boss 35 is slightly larger than the outer diameter of the coil spring 40. The inner diameter Lb of the upper portion of the boss is slightly smaller than the outer diameter of the coil spring 40. When inserting the coil spring 40 into the boss 35, a predetermined jig is used, and one end of the coil spring 40 is inserted, in a press fit manner, into the boss 35. Because the corner between the end surface and inner wall was chamfered, the press fit insertion of the coil spring 40 can be smoothly performed. Thus, the coil spring 40 can be positively fixed in the boss 35.

In addition to this, or alone, a similar configuration and fixing method can be applied for the boss 12 of the case 10 and coil spring 40.

FIGS. 15A, 15B, 15C, 15D shows a fifth variant embodiment of the sixth embodiment. In this fifth variant embodiment, instead of using the configuration shown in FIG. 9, the boss 12 of the case 10 has a cut-out portion C formed therein as shown in a cross-sectional view of FIG. 15D. The cut-out portion extends along the longitudinal axis (vertical direction in FIG. 15C) of the boss 12. The cut-out portion is used for electrical wires to pass therethrough, and the electrical wires are connected to a switch and so forth provided on the stick 20. The inner diameter of the boss 12 is slightly smaller than the outer diameter of the coil spring 40. A ring Rr is provided circumferentially on the outer wall of the boss 12. The ring Rr is a kind of coil spring, and has a strong elastic force so that it is difficult to expand the inner diameter thereof. The inner diameter of the ring Rr is slightly smaller than the outer diameter of the boss 12.

When fixing the coil spring 40 in the boss 12, a predetermined jig is used to insert, in a press fit manner, one end of the coil spring 40 into the boss 12. Then, by a force being applied using a predetermined jig J, the inner diameter of the ring Rr is expanded. Thereby, the inner diameter of the ring Rr becomes larger than the outer diameter of the boss which has the coil spring inserted therein. Then, the ring Rr is positioned so as to surround the boss 12. In this state, the jig J is removed. As a result, the ring Rr tends to return to the state having the original inner diameter through its elastic force. Thereby, the ring Rr presses the outer wall of the boss 12 inwardly and the coil spring 40 is positively fixed in the boss 12.

In addition to this, or alone, a similar configuration and fixing method can be applied for the boss 35 of the handle post 30 and coil spring 40.

Figure 16A:
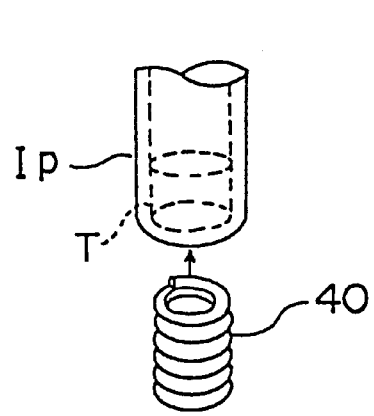
FIGS. 16A and 16B show a configuration of a sixth variant embodiment of the sixth embodiment.
Figure 16B:
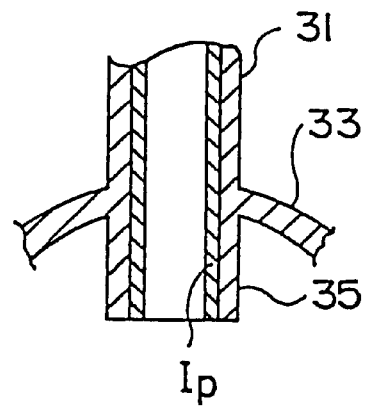

FIGS. 16A, 16B show a sixth variant embodiment of the sixth embodiment. In this variant embodiment, instead of using the configuration shown in FIG. 9, an insert pipe Ip is provided on the inner wall of the boss 35 of the handle post 30. This insert pipe is fixed to the inner wall of the boss 35 through insert molding. An internal thread is formed on the inner wall of a lower portion of the insert pipe Ip, as shown in FIG. 16A. The configuration of this internal thread corresponds to the arrangement of the wire turns of the spring 40. Therefore, by screwing the spring 40 into the lower portion of the insert pipe, the spring 40 is positively fixed in the boss 35.

In addition to this, or alone, a similar configuration and fixing method can be applied for the boss 12 of the case 10 and coil spring 40.

Figure 17A:
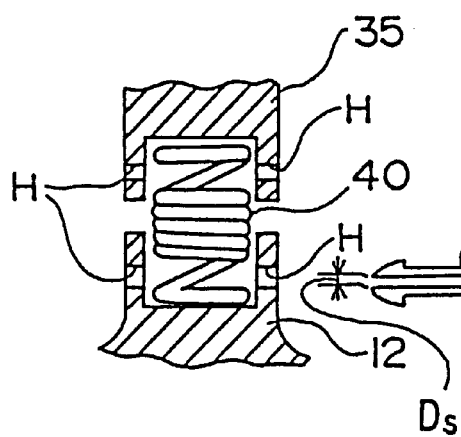
FIGS. 17A and 17B show a configuration of a seventh variant embodiment of the sixth embodiment.
Figure 17B:
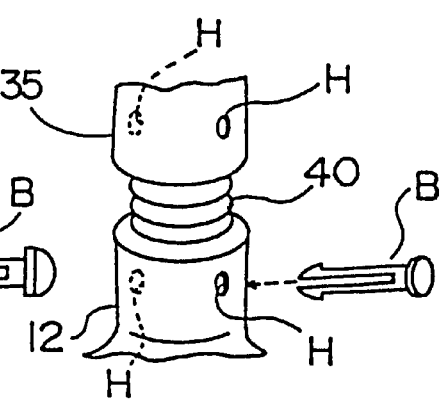

FIGS. 17A, 17B shows a seventh variant embodiment of the sixth embodiment. In this variant embodiment, instead of using the configuration shown in FIG. 9, a predetermined space is provided between the adjacent wire turns at each end of the spring 40, as shown in FIG. 17A. Through holes H are formed in each of the bosses 35 and 12 at positions, which correspond to the above-mentioned spaces provided at each end between adjacent wire turns after the spring 40 has been inserted into each of the bosses 35 and 12. Two fixing pins B are used for fixing the spring 40 in each of the bosses 35 and 12, respectively. Each fixing pin B has a slender portion extending from the head of the pin B. The slender portion is divided into two parts, the dividing line extending along the extending direction of the slender portion. At the extended end, the diameter of the slender portion sharply increased, and then is gradually decreased, that is, the extended end of the slender portion is tapered.

When fixing the spring 40 in the bosses 35, 12, the two ends of the spring 40 are inserted into the bosses 35, 12, respectively. In each boss, the fixing pin B is inserted into the near-side through hole H of the boss, and passes through the space between adjacent wire turns of the coil spring 40 and passes through the opposite-side through hole H of the boss. The diameter of the sharply enlarged end portion of each fixing pin B is slightly larger than the diameter of each through hole H. However, the slender portion of each fixing pin B is divided into two parts and a space is provided between the parts. When the tapered end of the fixing pin B is inserted into each through hole H, the space between the parts of the slender portion is gradually decreased along the taper shape of the tapered end. Thereby, the diameter of the sharply enlarged end portion of the fixing pin B is decreased, and the sharply enlarged end portion of the fixing pin B can pass each through hole H. Once the sharply enlarged end portion of the fixing pin B passes each through hole, it is difficult to draw out the fixing pin in the reverse direction. In fact, the sharply raised wall of the tapered portion of the fixing pin B is approximately parallel to the inner wall of the boss. Therefore, by only pressing the sharply enlarged portion against the inner wall of the boss surrounding each through hole H, the distance Ds between the parts of the slender portion cannot be decreased. If an external force causes the distance Ds between the parts of the slender portion to be decreased, the sharply enlarged end portion of the fixing pin B can be drawn out from a through hole H of the boss.

Thus, by passing the fixing pins through the through holes H and also through the spaces between the adjacent wire turns of the spring 40 respectively, the spring 40 is positively fixed in the bosses 12, 35.

Figure 18:
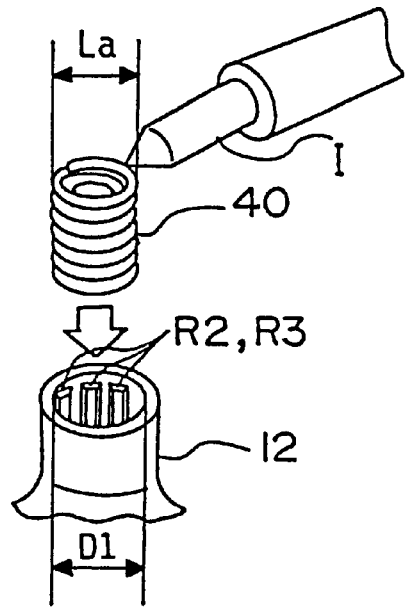
FIG. 18 shows a configuration of a eighth variant embodiment of the sixth embodiment.

FIG. 18 shows an eighth variant embodiment of the sixth embodiment. In this variant embodiment, instead of using the configuration shown in FIG. 9, the inner wall of the boss 12 has a plurality of projections R2, R3 projecting inwardly, as shown in a cross-sectional view of FIG. 20, and extending along the longitudinal direction (vertical direction in FIG. 18) of the boss 12, as shown in FIG. 18. The inner diameter D1 of the boss 12 is slightly larger than the outer diameter La of the coil spring 40. A distance D2, D3, shown in FIG. 20, between each opposite projection of the projections R2, R3 is slightly smaller than the outer diameter La of the coil spring 40. When inserting the coil spring 40 into the boss 12 and fixing it therein, a heating iron I is used for heating the coil spring 40 to a predetermined temperature. In the thus-heated state, an end of the coil spring 40 is pressed and inserted into the boss 12. As a result, the heat of the coil spring 40 melts the projections R2, R3 to some degree. Thus, the distance D2, D3 between each of the opposite projections of all or some opposite projections of the projections R2, R3 is increased to be substantially equal to the outer diameter La of the coil spring 40. The assembled coil spring 40 and boss 12 is then cooled and the projections R2, R3 solidify. Thereby, the coil spring 40 is positively fixed in the boss 12.

In addition to this, or alone, a similar configuration and fixing method can be applied for the boss 35 of the handle post 30 and coil spring 40.

Figure 19A:
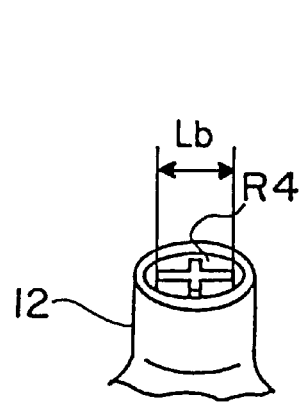
FIGS. 19A and 19B show a configuration of a ninth variant embodiment of the sixth embodiment.
Figure 19B:
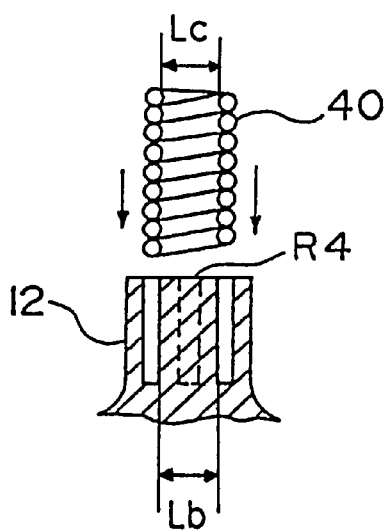

FIGS. 19A, 19B show a ninth variant embodiment of the sixth embodiment. In this variant embodiment, instead of using the configuration shown in FIG. 9, a projection R4 is formed in the inner space of the boss 12, as shown in FIGS. 19A, 19B. A cross section of the projection R4 is shaped as a cross. The projection R4 extends from the bottom of the boss 12 upwardly in FIGS. 19A, 19B. The horizontal (in FIG. 19B) length Lb, shown in FIG. 19A, between each of the opposite ends of the projection R4 is longer than the inner diameter Lc of the coil spring 40. When fixing the coil spring 40 in the boss 12, a force is applied to the coil spring 40. Thereby, the coil spring 40 is twisted in a predetermined direction (reverse to the wire winding direction of the coil spring 40) against the elastic force of the coil spring 40 so that the inner diameter Lc of the coil spring 40 is increased to some degree. After the inner diameter Lc of the coil spring 40 has been forceably increased, the coil spring 40 is inserted between the inner wall of the boss 12 and the outer ends of the projection R4 in a condition where the increased spring inner diameter is maintained. Then, the twisting force applied to the coil spring 40 is released. As a result, the coil spring 40 tends to return to the original inner diameter Lc due to the elastic force thereof. That is, the inner diameter Lc of the coil spring 40 tends to be decreased. As a result, the coil spring 40 presses the projection R4 inwardly due to the elastic force. Thus, the coil spring 40 is positively fixed in the boss 12.

Figure 20:
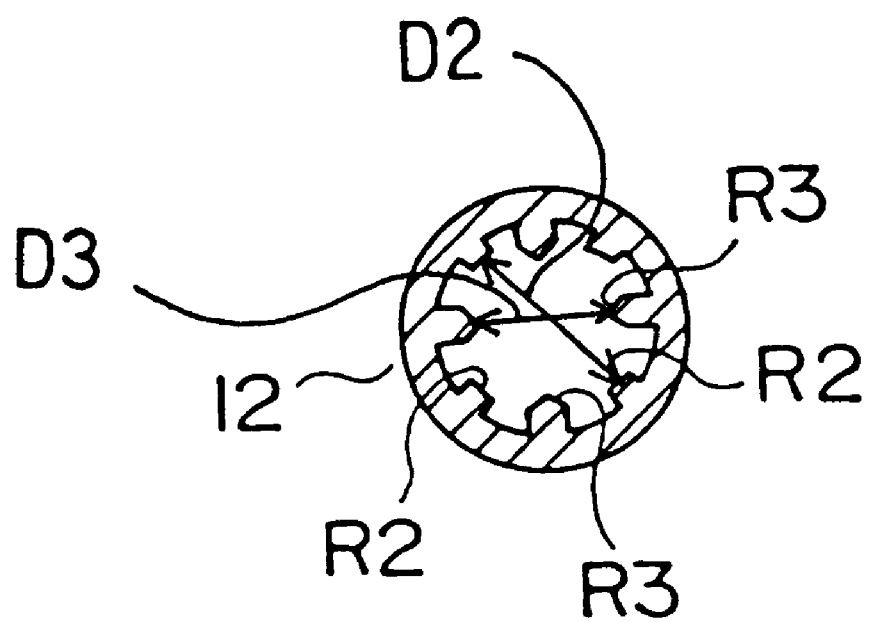
FIG. 20 shows a configuration of a tenth variant embodiment of the sixth embodiment.

In this embodiment, the ribs R2, R3 such as those shown in FIG. 20 are provided on the inner wall of the boss 12.

In addition to this, or alone, a similar configuration and fixing method can be applied for the boss 35 of the handle post 30 and coil spring 40.

FIG. 20 shows a tenth variant embodiment of the sixth embodiment. In this variant embodiment, instead of using the configuration shown in FIG. 9, similar to the above-described eighth variant embodiment, the plurality of projections R2, R3 are provided on the inner wall of the boss 12, as shown in FIG. 20 which shows a cross sectional view of the boss 12. As mentioned above, each projection R2, R3 extends in a direction perpendicular to the plane of FIG. 20. The distance D2, D3 between each of the opposite projections of the projections R2, R3 is slightly less than the outer diameter La of the coil spring 40. When fixing the coil spring 20 in the boss 12, the coil spring 20 is twisted in a direction (corresponding to the wire winding direction of the coil spring) against the elastic force of the coil spring 40. Thereby, the outer diameter La of the coil spring 40 is decreased so as to be approximately equal to the distance D2, D3 between each opposite projections of the projections R2, R3. In a condition where the decreased coil spring outer diameter is maintained, the coil spring 40 is inserted in the boss 12. Then, the twisting force applied to the coil spring 40 is released. As a result, due to the elastic force of the coil spring 40, the coil spring 40 tends to return to the original outer diameter La. That is, the outer diameter of the coil spring 40 tends to increase. Thereby, the coil spring 40 presses the projections R2, R3 outwardly. Thus, the coil spring 40 is positively fixed in the boss 12.

In this embodiment, eight projections project from the inner diameter of the boss 12. The eight projections are arranged so that the projection R3 and projection R2 occur alternately. Each projection R3 projects further inwardly than each projection R2. Each of the projections R3 may have a V-shaped cross-section edge, as shown in FIG. 20. In this case, the corner of the V-shaped edge comes into contact with the coil spring 40. It is also possible that each of the projections R3 has a square-shaped cross-section edge so that the plane of the edge comes into contact with the coil spring 40.

In addition to this, or alone, a similar configuration and fixing method can be applied for the boss 35 of the handle post 30 and coil spring 40.

The configurations of the above-described embodiments and variant embodiments may be appropriately combined, and further variant embodiments may be provided.

Further, the present invention is not limited to the above-described embodiments, and variations and modifications may be made without departing from the scope of the present invention.

What is claimed is:

1. A switch device, comprising:
   a handle post tiltable from a neutral position in response to an operational force being applied thereto;
   a coil spring with a plurality of turns, having a middle portion and two end portions, said middle portion having a space provided between each adjacent turn of said coil spring, said two end portions having an absence of space between each adjacent turn of said coil spring, one end of said coil spring being connected with said handle post; and
   a supporting member, the other end of said coil spring being connected with said supporting member, for supporting said handle post via said coil spring in a manner in which said handle post can tilt from said neutral position with respect to said supporting member.

2. The switch device according to claim 1 further including a centering elastic member for applying an elastic force to said handle post so as to return said handle post to said neutral position when said handle post has been tilted.

3. The switch device according to claim 2, wherein said centering elastic member comprises other coil springs, provided between said handle post and said supporting member in a plurality of directions, each of said directions being approximately perpendicular to a center axis of said handle post.

4. The switch device according to claim 2, wherein said centering elastic member comprises other coil springs, provided between said handle post and said supporting member in direction of the center axis of said handle post, and are arranged around said handle post.

5. The switch device according to claim 2, wherein said centering elastic member comprises a cushion member provided on said supporting member, said cushion member pushes said handle post when said handle post is tilted and applies a force to said cushion member.

6. A switch device, comprising:
   a handle post tiltable from a neutral position in response to an operational force being applied thereto;
   a coil spring, one end of said coil spring being connected with said handle post;
   a supporting member, the other end of said coil spring being connected with said supporting member, for supporting said handle post via said coil spring in a manner in which said handle post can tilt with respect to said supporting member from said neutral position; and
   engaging means for causing said coil spring to engage with at least one of said handle post and said supporting member, so as to prevent said coil spring from moving in said at least one of said handle post and said supporting member when said handle post is tilted, wherein said engaging means comprises a larger diameter portion formed as an end portion of said coil spring, said larger diameter portion having a larger diameter than a diameter of another portion of said coil spring, and an opening provided in at least one of said handle post and said supporting member, said opening having a diameter smaller than the outer diameter of said larger diameter portion of said coil spring and larger than the outer diameter of said another portion of said coil spring.

7. A switch device, comprising:
   a handle post tiltable from a neutral position in response to an operational force being applied thereto;
   a coil spring, one end of said coil spring being connected with said handle post;
   a supporting member, the other end of said coil spring being connected with said supporting member, for supporting said handle post via said coil spring in a manner in which said handle post can tilt with respect to said supporting member from said neutral position; and
   engaging means for causing said coil spring to engage with at least one of said handle post and said supporting member, so as to prevent said coil spring from moving in said at least one of said handle post and said supporting member when said handle post is tilted, wherein said engaging means comprises a boss provided on at least one of said handle post and said supporting member, and a substance which is provided between said coil spring and said boss in a melted state, said substance being solidified between said coil spring and said boss.

8. A switch device, comprising:
   a handle post tiltable from a neutral position in response to an operational force being applied thereto;
   a coil spring, one end of said coil spring being connected with said handle post;
   a supporting member, the other end of said coil spring being connected with said supporting member, for supporting said handle post via said coil spring in a manner in which said handle post can tilt with respect to said supporting member from said neutral position; and
   engaging means for causing said coil spring to engage with at least one of said handle post and said supporting member, so as to prevent said coil spring from moving in said at least one of said handle post and said supporting member when said handle post is tilted, wherein said engaging means comprises a boss provided on at least one of said handle post and said supporting member, and an engaging pin which passes through said boss and also passes through said coil spring.

9. A switch device, comprising:

a handle post tiltable from a neutral position in response to an operational force being applied thereto;

a coil spring, one end of said coil spring being connected with said handle post;

a supporting member, the other end of said coil spring being connected with said supporting member, for supporting said handle post via said coil spring in a manner in which said handle post can tilt with respect to said supporting member from said neutral position; and engaging means for causing said coil spring to engage with at least one of said handle post and said supporting member, so as to prevent said coil spring from moving in said at least one of said handle post and said supporting member when said handle post is tilted, wherein said engaging means comprises a boss provided on at least one of said handle post and said supporting member, a passing through member which has a through hole through which said coil spring passes, and a connecting screw which connects said passing through member to said boss.

10. A switch device, comprising:

a handle post tiltable from a neutral position in response to an operational force being applied thereto;

a coil spring, one end of said coil spring being connected with said handle post;

a supporting member, the other end of said coil spring being connected with said supporting member, for supporting said handle post via said coil spring in a manner in which said handle post can tilt with respect to said supporting member from said neutral position; and engaging means for causing said coil spring to engage with at least one of said handle post and said supporting member, so as to prevent said coil spring from moving in said at least one of said handle post and said supporting member when said handle post is tilted, wherein said engaging means comprises a boss provided on at least one of said handle post and said supporting member, said boss having a predetermined elasticity, said coil spring insertable therein, and another larger diameter coil spring which has an inner diameter smaller than an outer diameter of said boss, wherein an external force is applied to said larger diameter coil spring so as to enlarge the inner diameter, thereby said larger diameter coil spring is positioned to surround said boss, said larger diameter coil spring providing an inwardly directed force to said boss so as to prevent said coil spring inside of said boss from moving in said boss when said external force is removed.

11. A switch device, comprising:

a handle post tiltable from a neutral position in response to an operational force being applied thereto;

a coil spring, one end of said coil spring being connected with said handle post;

a supporting member, the other end of said coil spring being connected with said supporting member, for supporting said handle post via said coil spring in a manner in which said handle post can tilt with respect to said supporting member from said neutral position; and engaging means for causing said coil spring to engage with at least one of said handle post and said supporting member, so as to prevent said coil spring from moving in said at least one of said handle post and said supporting member when said handle post is tilted, said engaging means comprises a predetermined space formed between adjacent end turns of said coil spring, a boss provided on at least one of said handle post and said supporting member, a through hole provided in said boss, and a passing through pin which passes through said predetermined space of said coil spring and also passes through said through hole of said boss.

12. A switch device, comprising:

a handle post tiltable from a neutral position in response to an operational force being applied thereto;

a coil spring, one end of said coil spring being connected with said handle post;

a supporting member, the other end of said coil spring being connected with said supporting member, for supporting said handle post via said coil spring in a manner in which said handle post can tilt with respect to said supporting member from said neutral position; and engaging means for causing said coil spring to engage with at least one of said handle post and said supporting member, so as to prevent said coil spring from moving in said at least one of said handle post and said supporting member when said handle post is tilted, wherein said engaging means comprises a boss provided on at least one of said handle post and said supporting member, and projections which project from the inner wall of said boss, wherein a distance between facing ends of said projections is less than an outer diameter of said coil spring, said projections being melted as a result of said coil spring being heated, pressed and inserted into said boss.

13. A switch device, comprising:

a handle post tiltable from a neutral position in response to an operational force being applied thereto;

a coil spring, one end of said coil spring being connected with said handle post;

a supporting member, the other end of said coil spring being connected with said supporting member, for supporting said handle post via said coil spring in a manner in which said handle post can tilt with respect to said supporting member from said neutral position; and engaging means for causing said coil spring to engage with at least one of said handle post and said supporting member, so as to prevent said coil spring from moving in said at least one of said handle post and said supporting member when said handle post is tilted, wherein said engaging means comprises a boss provided on at least one of said handle post and said supporting member, and projections projecting from the inner wall of said boss, wherein a distance between facing ends of said projections is less than an outer diameter of said coil spring; and an external force is applied to said coil spring for twisting said coil spring in a predetermined direction such that said outer diameter of said coil spring is decreased, said coil spring being thereby insertable in said boss and an elastic force of said coil spring causing said coil spring to push said projections outwardly.

14. A switch device, comprising:

a handle post tiltable from a neutral position in response to an operational force being applied thereto;

a coil spring, one end of said coil spring being connected with said handle post;

a supporting member, the other end of said coil spring being connected with said supporting member, for supporting said handle post via said coil spring in a manner in which said handle post can tilt with respect to said supporting member from said neutral position; and engaging means for causing said coil spring to engage with at least one of said handle post and said supporting member, so as to prevent said coil spring from moving in said at least one of said handle post and said supporting member when said handle post is tilted, wherein said engaging means comprises a boss provided on at least one of said handle post and said supporting member, and projections, each projection extending outwardly from the center axis of said boss, wherein a distance between opposite faces of said projections is greater than the inner diameter of said coil spring; and an external force is applied to said coil spring for twisting said coil spring in a predetermined direction such that an inner diameter of said coil spring is increased, said coil spring being insertable in a space between said projections and the inner wall of said boss, and an elastic force of said coil spring causing said coil spring to push inwardly said projections.

15. A switch device, comprising:

a handle post tiltable from a neutral position in response to an operational force being applied thereto;

a coil spring, one end of said coil spring being connected with said handle post;

a supporting member, the other end of said coil spring being connected with said supporting member, for supporting said handle post via said coil spring in a manner in which said handle post can tilt with respect to said supporting member from said neutral position; and engaging means for causing said coil spring to engage with at least one of said handle post and said supporting member, so as to prevent said coil spring from moving in said at least one of said handle post and said supporting member when said handle post is tilted, wherein said engaging means comprises a boss provided on at least one of said handle post and said supporting member, an inner diameter of said boss at an end thereof being larger than an inner diameter of an inside portion of said boss, wherein an outer diameter of said coil spring is smaller than said inner diameter of said boss at the end thereof and larger than said inner diameter of said inside portion of said boss, said coil spring being press fitted into said boss.

16. A switch device, comprising:

a handle post tiltable from a neutral position in response to an operational force being applied thereto;

a coil spring, one end of said coil spring being connected with said handle post to provide a first supporting contact to said handle post to provide a first supporting contact to said handle post;

a supporting member, the other end of said coil spring being connected with said supporting member, for supporting said handle post via said coil spring in a manner in which said handle post can tilt from said neutral position with respect to said supporting member; and a centering elastic member to provide a second supporting contact to said handle post for applying an elastic force to said handle post so as to return said handle post to said neutral position when said handle post has been tilted, said handle post is only directly contacted by said first and second supporting contacts, and said centering elastic member comprises a cushion member provided on said supporting member, said cushion member pushes said handle post when said handle post is tilted and applies a force to said cushion member.

17. A switch device, comprising:

a handle post tiltable from a neutral position in response to an operational force being applied thereto;

a coil spring, one end of said coil spring being connected with said handle post to provide the only direct supporting connection to said handle post;

a supporting member, the other end of said coil spring being connected with said supporting member, for supporting said handle post via said direct connection with said coil spring in a manner in which said handle post can tilt with respect to said supporting member from said neutral position; and engaging means for causing said coil spring to engage with at least one of said handle post and said supporting member, so as to prevent said coil spring from moving relative to at least one of said handle post and said supporting member when said handle post is tilted, wherein said engaging means comprises a larger diameter portion formed as an end portion of said coil spring, said larger diameter portion having a larger diameter than a diameter of another portion of said coil spring, and an opening provided in at least one of said handle post and said supporting member, said opening have a diameter smaller than the outer diameter of said larger diameter portion of said coil spring and larger than the outer diameter of said another portion of said coil spring.

18. A switch device, comprising:

a handle post tiltable from a neutral position in response to an operational force being applied thereto;

a coil spring, one end of said coil spring being connected with said handle post to provide the only direct supporting connection to said handle post;

a supporting member, the other end of said coil spring being connected with said supporting member, for supporting said handle post via said direct connection with said coil spring in a manner in which said handle post can tilt with respect to said supporting member from said neutral position; and engaging means for causing said coil spring to engage with at least one of said handle post and said supporting member, so as to prevent said coil spring from moving relative to at least one of said handle post and said supporting member when said handle post is tilted, wherein said engaging means comprises a boss provided on at least one of said handle post and said supporting member, and a substance which is provided between said coil spring and said boss in a melted state, said substance being solidified between said coil spring and said boss.

19. The switch device according to claim 18, wherein said substance comprises one of a predetermined resin and an adhesive.

20. A switch device, comprising
a handle post tiltable from a neutral position in response to an operational force being applied thereto;
a coil spring, one end of said coil spring being connected with said handle post to provide the only direct supporting connection to said handle post;
a supporting member, the other end of said coil spring being connected with said supporting member, for supporting said handle post via said direct connection with said coil spring in a manner in which said handle post can tilt with respect to said supporting member from said neutral position; and
engaging means for causing said coil spring to engage with at least one of said handle post and said supporting member, so as to prevent said coil spring from moving relative to at least one of said handle post and said supporting member when said handle post is tilted, wherein said engaging means comprises a boss provided on at least one of said handle post and said supporting member, and an engaging pin which passes through said boss and also passes through said coil spring.

21. A switch device, comprising:
a handle post tiltable from a neutral position in response to an operational force being applied thereto;
a coil spring, one end of said spring being connected with said handle post to provide the only direct supporting connection to said handle post;
a supporting member, the other end of said coil spring being connected with said supporting member, for supporting said handle post via said direct connection with said coil spring in a manner in which said handle post can tilt with respect to said supporting member from said neutral position; and
engaging means for causing said coil spring to engage with at least one of said handle post and said supporting member, so as to prevent said coil spring from moving relative to at least one of said handle post and said supporting member when said handle post is tilted, wherein said engaging means comprises a boss provided on at least one of said handle post and said supporting member, a passing through member which has a through hole through which said coil spring passes, and a connecting screw which connects said passing through member to said boss.

22. A switch device, comprising:
a handle post tiltable from a neutral position in response to an operational force being applied thereto;
a coil spring, one end of said coil spring being connected with said handle post to provide the only direct supporting connection to said handle post;
a supporting member, the other end of said coil spring being connected with said supporting member, for supporting said handle post via said direct connection with said coil spring in a manner in which said handle post can tilt with respect to said supporting member from said neutral position; and
engaging means for causing said coil spring to engage with at least one of said handle post and said supporting member, so as to prevent said coils spring from moving relative to at least one of said handle post and said supporting member when said handle post is tilted, wherein said engaging means comprises a boss provided on at least one of said handle post and said supporting member, said boss having a predetermined elasticity, said coil spring insertable therein, and another larger diameter coil spring which has an inner diameter smaller than an outer diameter of said boss, wherein an external force is applied to said larger diameter coil spring so as to enlarge the inner diameter, thereby said larger diameter coil spring is positioned to surround said boss, said larger diameter coil spring providing an inwardly directed force to said boss so as to prevent said coil spring inside of said boss from moving in said boss when said external force is removed.

23. A switch device, comprising;
a handle post tiltable from a neutral position in response to an operational force being applied thereto;
a coil spring, one end of said coil spring being connected with said handle post to provide the only direct supporting connection to said handle post;
a supporting member, the other end of said coil spring being connected with said supporting member, for supporting said handle post via said direct connection with said coil spring in a manner in which said handle post can tilt with respect to said supporting member from said neutral position; and
engaging means for causing said coil spring to engage with at least one of said handle post and said supporting member, so as to prevent said coil spring from moving relative to at least one of said handle post and said supporting member when said handle post is tilted, said engaging means comprises a predetermined space formed between adjacent end turns of said coil spring, a boss provided on at least one of said handle post and said supporting member, a through hole provided in said boss, and a passing through pin which passes through said predetermined space of said coil spring and also passes through said through hole of said boss.

24. A switch device, comprising:
a handle post tiltable from a neutral position in response to an operational force being applied thereto;
a coil spring, one end of said coil spring being connected with said handle post to provide the only direct supporting connection to said handle post;
a supporting member, the other end of said coil spring being connected with said supporting member, for supporting said handle post via said direct connection with said coil spring in a manner in which said handle post can tilt with respect to said supporting member from said neutral position; and
engaging means for causing said coil spring to engage with at least one of said handle post and said supporting member, so as to prevent said coil spring from moving relative to at least one of said handle post and said supporting member when said handle post is tilted, wherein said engaging means comprises a boss provided on at least one of said handle post and said supporting member, and projections which project from the inner wall of said boss, wherein a distance between facing ends of said projections is less than an outer diameter of said coil spring, said projections being melted as a result of said coil spring being heated, pressed and inserted into said boss.

25. A switch device, comprising:
a handle post tiltable from a neutral position in response to an operational force being applied thereto;

a coil spring, one end of said coil spring being connected with said handle post to provide the only direct supporting connection to said handle post;

a supporting member, the other end of said coil spring being connected with said supporting member, for supporting said handle post via said direct connection with said coil spring in a manner in which said handle post can tilt with respect to said supporting member from said neutral position; and engaging means for causing said coil spring to engage with at least one of said handle post and said supporting member, so as to prevent said coil spring from moving relative to at least one of said handle post and said supporting member when said handle post is tilted, wherein said engaging means comprises a boss provided on at least one of said handle post and said supporting member, and projections projecting from the inner wall of said boss, wherein a distance between facing ends of said projections is less than an outer diameter of said coil spring; and an external force is applied to said coil spring for twisting said coil spring in a predetermined direction such that said outer diameter of said coil spring is decreased, said coil spring being thereby insertable in said boss and an elastic force of said coil spring causing said coil spring to push said projections outwardly.

26. A switch device, comprising:

a handle post tiltable from a neutral position in response to an operational force being applied thereto;

a coil spring, one end of said coil spring being connected with said handle post to provide the only direct supporting connection to said handle post;

a supporting member, the other end of said coil spring being connected with said supporting member, for supporting said handle post via said direct connection with said coil spring in a manner in which said handle post can tilt with respect to said supporting member from said neutral position; and engaging means for causing said coil spring to engage with at least one of said handle post and said supporting member, so as to prevent said coil spring from moving relative to at least one of said handle post and said supporting member when said handle post is tilted, wherein said engaging means comprises a boss provided on at least one of said handle post and said supporting member, and projections, each projection extending outwardly from the center axis of said boss, wherein a distance between opposite faces of said projections is greater than the inner diameter of said coil spring and an external force is applied to said coil spring for twisting said coil spring in a predetermined direction such that an inner diameter of said coil spring is increased, said coil spring being insertable in a space between said projections and the inner wall of said boss, and an elastic force of said coil spring causing said coil spring to push inwardly said projections.

27. A switch device, comprising:

a handle post tiltable from a neutral position in response to an operational force being applied thereto;

a coil spring, one end of said coil spring being connected with said handle post to provide the only direct supporting connection to said handle post;

a supporting member, the other end of said coil spring being connected with said supporting member, for supporting said handle post via said direct connection with said coil spring in a manner in which said handle post can tilt with respect to said supporting member from said neutral position; and engaging means for causing said coil spring to engage with at least one of said handle post and said supporting member, so as to prevent said coil spring from moving relative to at least one of said handle post and said supporting member when said handle post is tilted, wherein said engaging means comprises a boss provided on at least one of said handle post and said supporting member, an inner diameter of said boss at an end thereof being larger than an inner diameter of an inside portion of said boss, wherein an outer diameter of said coil spring is smaller than said inner diameter of said boss at the end thereof and larger than said inner diameter of said inside portion of said boss, said coil spring being press fitted into said boss.

* * * * *